United States Patent
Suzuki et al.

(10) Patent No.: US 7,605,358 B2
(45) Date of Patent: Oct. 20, 2009

(54) PHOTODETECTOR HAVING DUAL PHOTODIODE AND GAIN ADJUSTING AMPLIFIERS

(75) Inventors: Takayuki Suzuki, Hamamatsu (JP); Shintaro Meguri, Hamamatsu (JP); Takashi Asahara, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/632,906

(22) PCT Filed: Jul. 22, 2005

(86) PCT No.: PCT/JP2005/013457

§ 371 (c)(1),
(2), (4) Date: May 9, 2008

(87) PCT Pub. No.: WO2006/009243

PCT Pub. Date: Jan. 26, 2006

(65) Prior Publication Data

US 2008/0217516 A1 Sep. 11, 2008

(30) Foreign Application Priority Data

Jul. 22, 2004 (JP) .............................. 2004-214949

(51) Int. Cl.
*H01J 40/14* (2006.01)

(52) U.S. Cl. ........................... 250/214 R; 250/214 AG

(58) Field of Classification Search ............. 250/214 R, 250/214.1, 214 AG, 214 LA; 330/59, 254; 327/514, 517
See application file for complete search history.

(56) References Cited

U.S. PATENT DOCUMENTS 4,651,226 A * 3/1987 Motoori et al. ............. 358/497
2002/0175272 A1 11/2002 Shimizu

FOREIGN PATENT DOCUMENTS

JP 1-105134 4/1989

(Continued)

*Primary Examiner*—Que T Le
(74) *Attorney, Agent, or Firm*—Drinker Biddle & Reath LLP

(57) ABSTRACT

There is provided a photodetector applicable to communications requiring a high speed and broad dynamic range. When a photocurrent output of a photodiode 14 for detecting optical power is lower than a specified value, the output of a comparator COMP1 is rapidly switched, however, a low pass filter SC removes high harmonic components, so that the voltage of a gain control terminal VG as the output of the low pass filter SC is gradually lowered. Therefore, a current amount flowing between the source and drain of a gain adjusting N-type MOS transistor GCT to which the voltage is applied is gradually reduced, the current amount flowing via a resistor R1 is reduced, the resistance value Rx of the composite resistor of the gain adjusting amplifier AMP is increased, so that the gain of the gain adjusting amplifier AMP gradually increases to a specified gain. In this case, the time period from the increase in the output voltage until the saturation thereof is within 3 μs. However, by slowly varying the gain of the output voltage as described above, an adverse effect on a PHY chip connected at the rear stage can be suppressed.

4 Claims, 18 Drawing Sheets

FOREIGN PATENT DOCUMENTS

| | | |
|---|---|---|
| JP | 2-143731 | 6/1990 |
| JP | 4-167633 | 6/1992 |
| JP | 9-131337 | 5/1997 |
| JP | 10-107738 | 4/1998 |
| JP | 11-41180 | 2/1999 |
| JP | 2000-200922 | 7/2000 |
| JP | 2002-353495 | 12/2002 |
| WO | WO 01/15348 | 3/2001 |

* cited by examiner

PHOTODETECTOR HAVING DUAL PHOTODIODE AND GAIN ADJUSTING AMPLIFIERS

TECHNICAL FIELD

The present invention relates to a photodetector.

BACKGROUND ART

A device having a high speed and broad dynamic range has been required in communications using POF (plastic optical fiber).

A photodetection used in such an application has been required.

Conventionally, it has been hitherto widely known that a feedback circuit is used for a current-voltage converting amplifier for converting a current output of a photodetecting element to a voltage to broaden the dynamic range (see Patent Document 1).

Furthermore, there is also known a receiving circuit of an optical coupling device in which a dummy photodiode is provided to shape the waveform, thereby enhancing a common mode noise rejection ratio. Specifically, it is known that the outputs of the photodiode for photodetecting and the light-shielded photodiode are subjected to gain adjustment, and then the difference therebetween is taken to carry out photodetection (see Patent Document 2).

There is also known a circuit having control means for varying the output of a second photodetecting element to incident light corresponding to the output from a first photodetecting element (see Patent Document 3).

There is known a device in which a light input is branched to two output parts, one output part is delayed and then applied to a photodetecting element while the other output part is applied to another photodetecting element, and when the output voltage thereof or the output voltage of a photodetecting element contained in an optical amplifier exceeds a reference value, the bias voltage of the photodetecting element is lowered, an attenuator is controlled to lower the input light to the photodetecting element, or the output light of the optical amplifier is attenuated and applied to APD as the photodetecting element concerned (see Patent Document 4).

Furthermore, there is also known a construction that in order to enlarge the dynamic range and save the power consumption, a current output from a photodetecting element is monitored by a monitor circuit, the monitored value is compared with a predetermined reference value to judge whether the photodetection level is larger or smaller than an appropriate value, and any one of a through circuit constituting a multi-stage amplifier connected to the photodetecting element or a gain adjusting amplifying circuit on the basis of the above judgment result. Furthermore, there is provided a construction in which the output of a monitor circuit is applied to a variable gain type initial stage amplifying circuit to enable the gain control corresponding to the photodetection level (see Patent Document 5).

Patent Document 1: Japanese Published Unexamined Patent Application No. 2-143731
Patent Document 2: Japanese Published Unexamined Patent Application No. 2002353495
Patent Document 3: Japanese Published Unexamined Patent Application No. 2000-200922
Patent Document 4: Japanese Published Unexamined Patent Application No. 11-41180
Patent Document 5: Japanese Published Unexamined Patent Application No. 10-107738

DISCLOSURE OF THE INVENTION

Problem to be Solved by the Invention

However, when the conventional photodetector is applied to communications needing a high speed and broad dynamic range described above and when the gain switching is sharply carried out, an error may occur at the circuit side of the rear stage. Specifically, in the case of a communications system for extracting a clock from a received signal and establish synchronization, there is a problem that an error occurs at the PLL (phase-locked loop) circuit side.

The present invention has been implemented in view of the foregoing problem, and has an object to provide a photodetector that is applicable to communications requiring a high speed and broad dynamic range.

Means for Solving the Problems

In order to solve the above problem, the photodetector according to the present invention is equipped with a first photodiode for photodetecting, a light-shielded second photodiode, a first differential amplifier to which the outputs of the first and second photodiodes are input, gain adjusting amplifiers which are respectively interposed between the first photodiode and the first differential amplifier and between the second photodiode and the first differential amplifier, an optical power detector for detecting optical power on the basis of a comparator output, and a low pass filter interposed between the output terminal of the optical power detector and the gain adjusting terminal of the gain adjusting amplifier.

According to the photodetector, the outputs of the first and second photodiodes are input to the first differential amplifier, so that dark current flowing commonly via both the first and second photodiodes is removed, and thus low noise can be achieved. The gain adjusting amplifier can adjust the gain corresponding to the input to the gain adjusting terminal. Therefore, by inputting the output of the optical power detector to the gain adjusting terminal, saturation of the amplifier concerned can be suppressed, and the dynamic range can be broadened.

Since the optical power detector uses the comparator output, the output thereof can be varied at high speed with respect to the optical power exceeding a specified level. However, in high-speed communications, particularly in the case of a receiving system for extracting a clock from a received signal at the rear stage side to establish synchronization, an error may occur in the conventional photodetector. This is because the output signal from the comparator exceeds the frequency (phase) which a PLL (Phase-locked Loop) circuit for extracting a clock to establish synchronization can follow, for example.

In this photodetector, the low pass filter is interposed between the optical power detector and the gain adjusting terminal, and thus the variation rate of the input to the gain adjusting terminal can be restricted by cutting high frequency components (higher harmonic waves) contained in a rectangular wave of the comparator output and slowly change the comparator output, and thus the error in the circuit at the rear stage can be suppressed. Accordingly, the high-speed communications can be performed. The low pass filter can be constructed by using a charging/discharging function of a capacitor.

Furthermore, it is desired that the optical power detector is equipped with a third photodiode for photodetecting, a light-shielded fourth photodiode, a second differential amplifier to which the outputs of the third and fourth photodiodes are input, and the above-described comparator to which the output of the differential amplifier is input.

In this case, the outputs of the third and fourth photodiodes are input to the second differential amplifier, so that dark current flowing commonly via both the third and fourth photodiodes is removed and an output having a low noise can be achieved from the second differential amplifier and then input to the comparator. The output of the comparator is switched when optical power exceeding a reference level is input to the comparator.

It is preferable that the gain adjusting amplifier is equipped with a plurality of resistors interposed in parallel between the input and output terminals of an operational amplifier, and a transistor connected to these resistors in series, and the control terminal of the transistor is set as the gain adjusting terminal. In this case, the resistance value of the resistor through which the input and output terminals of the operational amplifier are connected is varied corresponding to the input to the gain adjusting terminal, so that the gain adjusting can be performed.

Effects of the Invention

The photodetector of the present invention can be applied to communications requiring a high speed and broad dynamic range.

Figure 1:
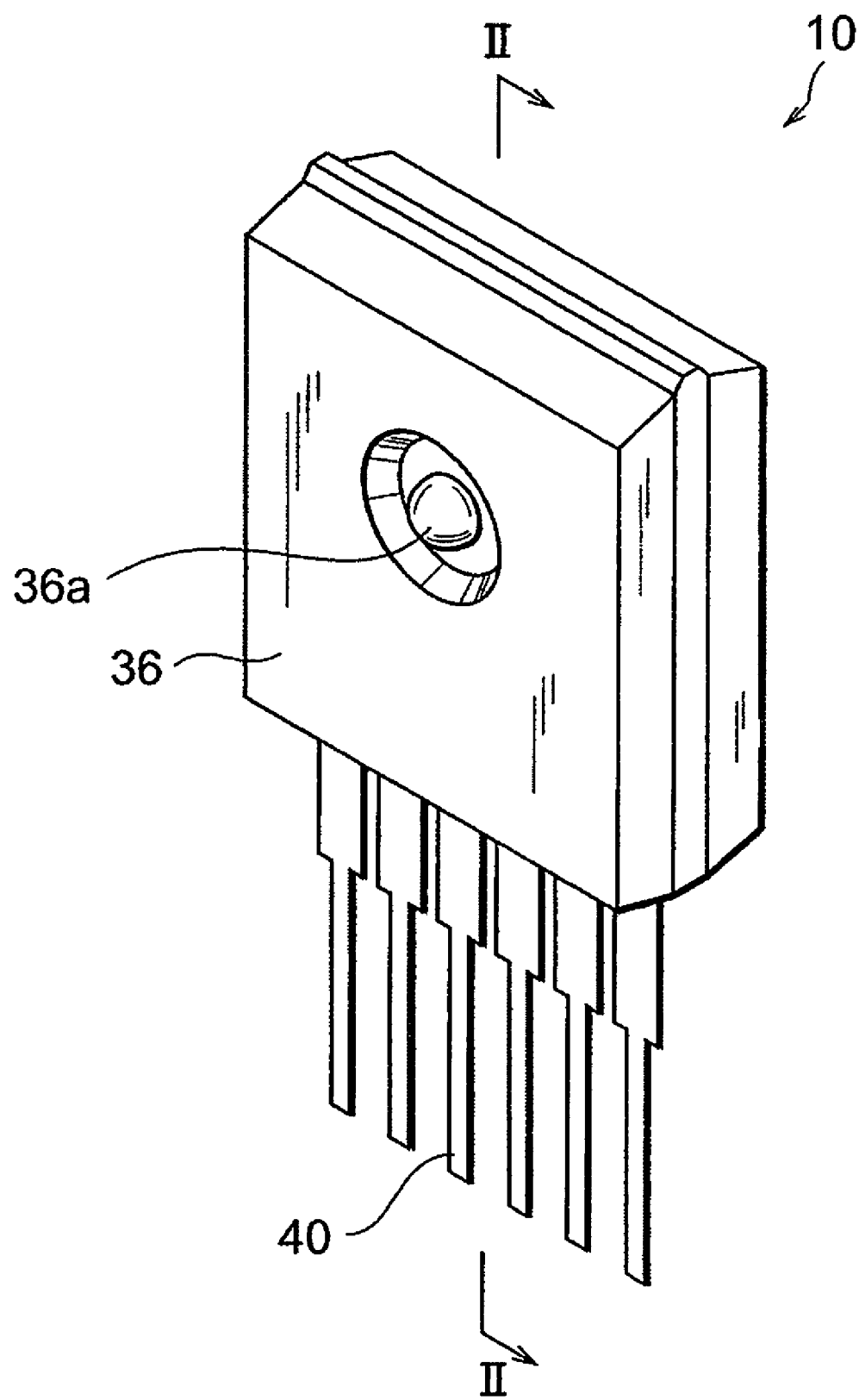
FIG. 1 is a perspective view showing a photodetector.

DESCRIPTION OF SYMBOLS 10 photodetector
12, 14 photodiode
14a detector
20 monolithic circuit board
34 lead frame
35 mold portion
36a lens portion
38 wire
40 lead pin
100 plastic optical fiber
102 ferrule
104 fiber connector
105 receptacle
106 PHY chip
AMP gain adjusting amplifier
BIAS bias circuit
C1 capacitor
C10 capacitor
CB circuit board
CC1 capacitor
CC2 capacitor
CM1 current mirror circuit
CM2 current mirror circuit
CM3 current mirror circuit
COMP1 comparator
D differential amplifying circuit
DIF1 differential amplifier
FIF2 differential amplifier
GCT gain adjusting transistor
IS current mirror circuit
JO judging output terminal
L level adjusting circuit
OP operational amplifier
OPD optical power detector
PJ peak detector
PM power management terminal
PMJ power management judging circuit
Q1 transistor
Q2 transistor
Q3 transistor
Q21 transistor
QA QB, QC, QP, QN transistor
R1, R2 resistor
S NAND circuit
SC low pass filter
SD signal detection terminal
SDJ signal detecting judgment circuit
SM semiconductor substrate
SWT transistor

BEST MODES FOR CARRYING OUT THE INVENTION

A photodetector according to an embodiment will be described hereunder. The same elements are represented by the same reference numerals, and overlapping description thereof is omitted.

Figure 2:
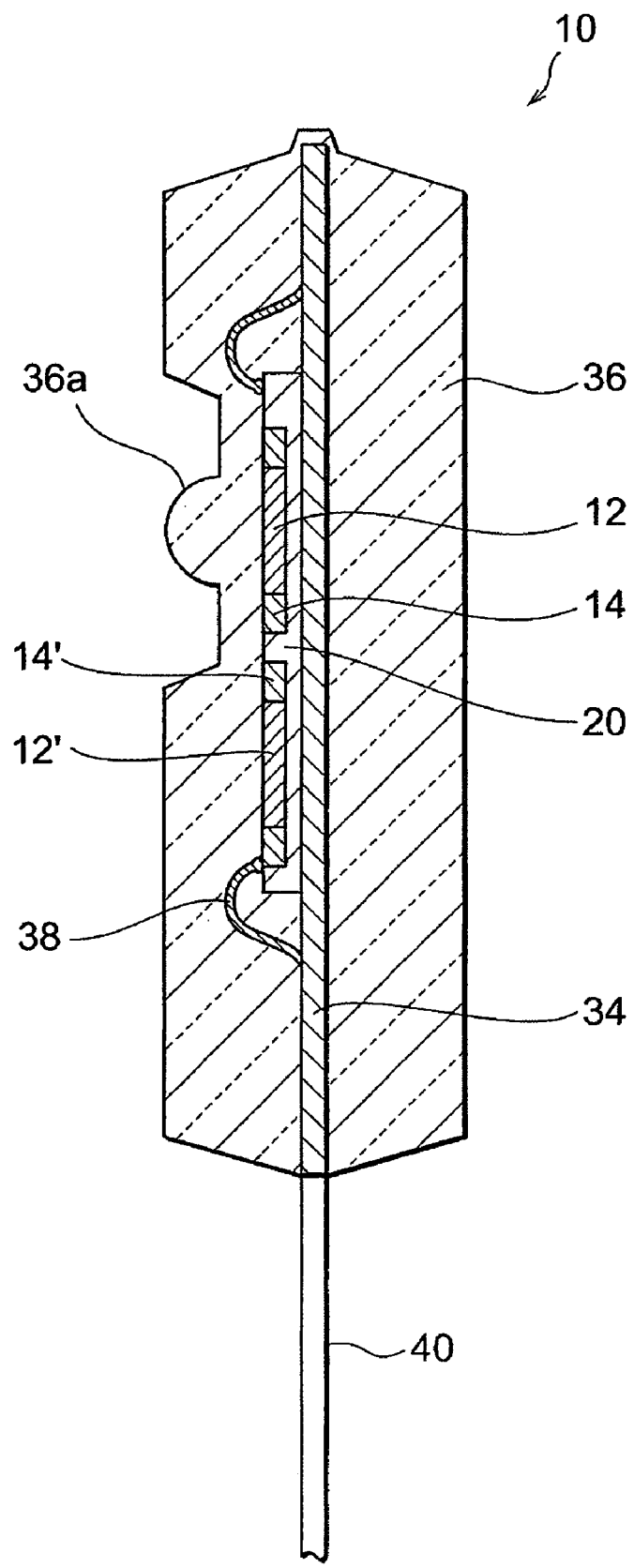
FIG. 2 is a cross-sectional view of the photodetector which is taken along an arrow of II-II.

FIG. 1 is a perspective view showing an optical detector. FIG. 2 is a cross-sectional view of the photodetector which is taken along an arrow II-II.

The photodetector 10 is constituted of photodiodes 12, 14 for photodetecting, light-shielded photodiodes 12' and 14' and a monolithic circuit board 20 that are sealed by resin. More specifically, the board 20 is sealed by transparent resin under a state that it is fixed on a lead frame 34, and a mold potion 36 for resin-sealing the board 20 has a substantially rectangular parallelepiped shape.

The board 20 and the lead frame 34 are electrically connected to each other through a wire 38, and a pin 40 that is electrically connected to the lead frame 34 is provided so as to project to the outside of the mold potion 36. Accordingly, an optical signal received by the photodetector 10 is read out to the outside via the pin 40. Furthermore, a semispherical lens portion 36a is formed so as to confront the photodiode 12 on the surface of the mold portion 36 so that the signal light can be efficiently made incident to the photodiode 12.

Figure 3:
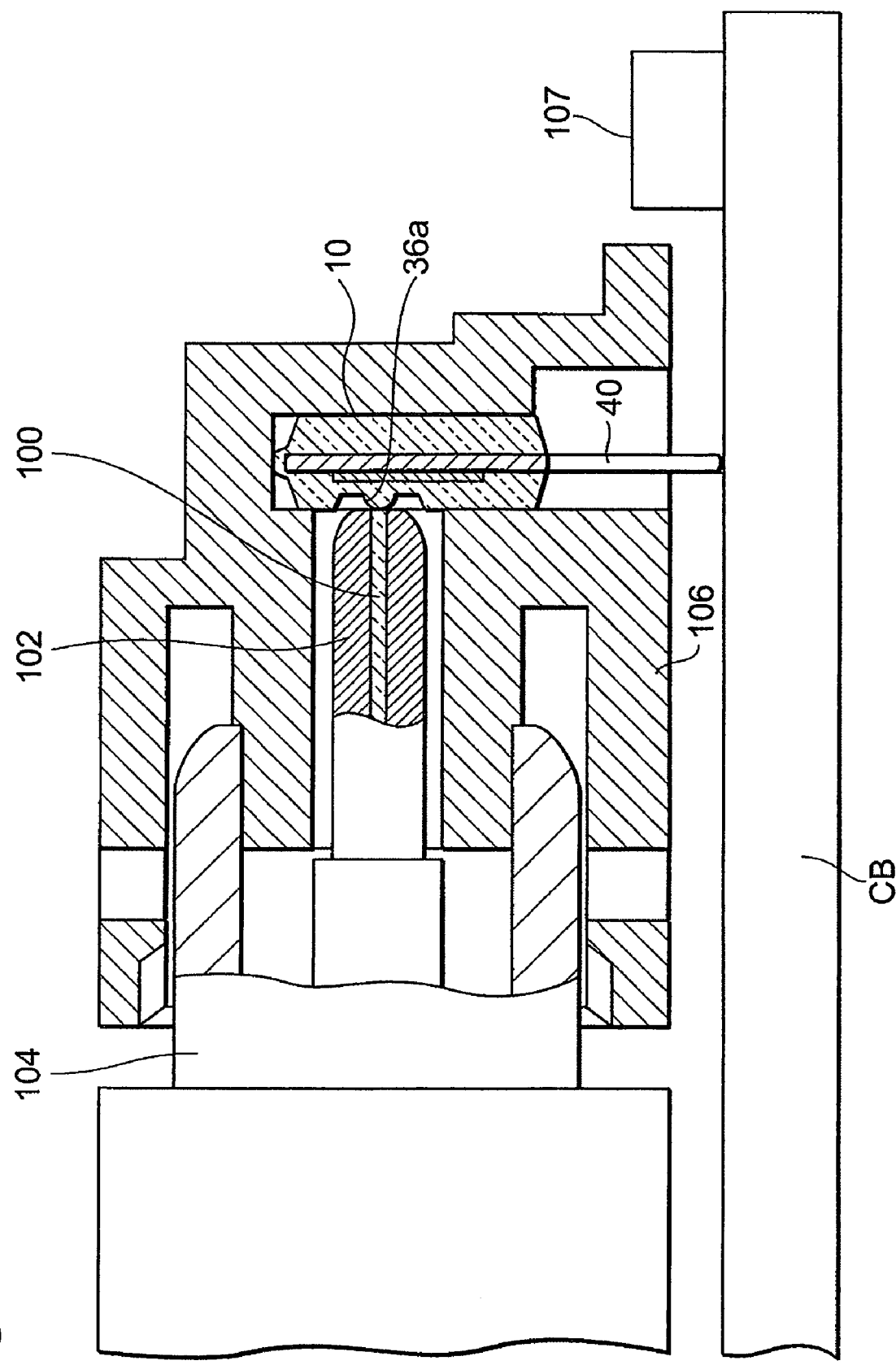
FIG. 3 is a cross-sectional view showing a photodetecting unit in which a photodetector is installed.

FIG. 3 is a cross-sectional view showing a photodetecting unit in which the photodetector is installed.

The photodetector 10 is disposed and used such that the lens portion 36a thereof faces the emission end of a plastic optical fiber 100 through which signal light propagates. Here, the tip portion of the plastic optical fiber 100 is provided with a ferrule 102 for protecting the tip portion of the plastic optical fiber 100, and further provided with a fiber connector 104.

Furthermore, the positioning of the photodetector 10 with respect to the emission end of the plastic optical fiber 100 is carried out by inserting the fiber connector 104 and the photodetector 10 into a fiber connector groove portion and a photodetector groove portion formed in a receptacle 106. In the photodetector 10, a lead pin 40 is inserted into the circuit board CB and electrically connected to a PHY (physical layer) chip 107.

Figure 4:
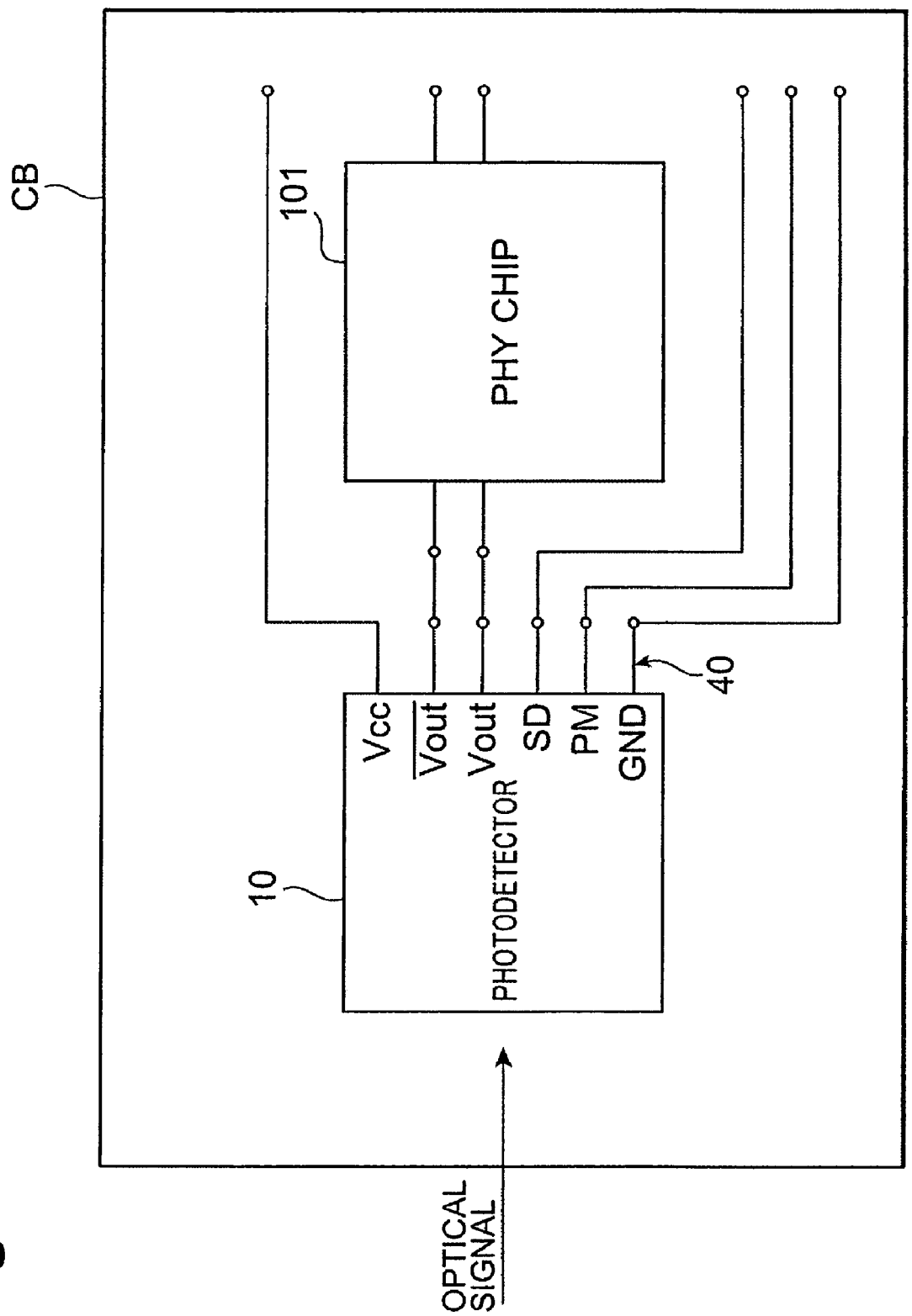
FIG. 4 is a block diagram showing a photodetecting unit.

FIG. 4 is a block diagram showing the photodetecting unit.

The photodetector 10 has six lead pins (terminals) 40, and the respective lead pins 40 constitute a power source voltage applied terminal Vcc, an LVDS output terminal $V_{out}$, an LVDS inverted output terminal $V_{OUT}$ bar, a signal detection terminal SD, a power management terminal PM, a ground terminal GND. A printed wire is provided on the circuit board CB, and the LVDS output terminal (inverted output terminal) of the photodetector 10 is connected to the PHY chip 107 via the wire concerned.

LVDS (Low Voltage Differential Signaling) is a technique of transmitting video pictures, 3-D graphics or image data from a camera to a PC or a printer via LAN (Local Area Network) connected to a household digital video deck, a telephone circuit and a satellite line. This is one of the systems for performing data communications on the basis of a differential signal having ultrasmall amplitude via two wire patterns formed by a PCB (print circuit board), and this differential data transmission system has a characteristic that it is hardly influenced by common mode noises.

In LVDS, data transmission in a single channel can be performed at a speed of several hundreds to several thousands Mbps, and also a small amplitude signal is output by a driving circuit of a current mode, so that a ringing and switching spike hardly occur and thus a signal having a low power consumption and a low noise can be transmitted over a broad frequency band.

A PLL circuit in the PHY chip generates a reading timing of a signal in synchronization with an LVDS output signal of the photodetector 10. In this photodetector 10, the gain adjustment is carried out, and the phase is also varied simultaneously with the output signal amplitude at the switching time of the gain. Accordingly, the output signal is shifted on the time axis simultaneously with the gain switching operation. When the gain switching is instantaneously performed, the phase variation also occurs instantaneously, so that the PLL circuit in the PHY chip 107 cannot follow the instantaneous variation concerned and thus induces a communication error.

Figure 5:
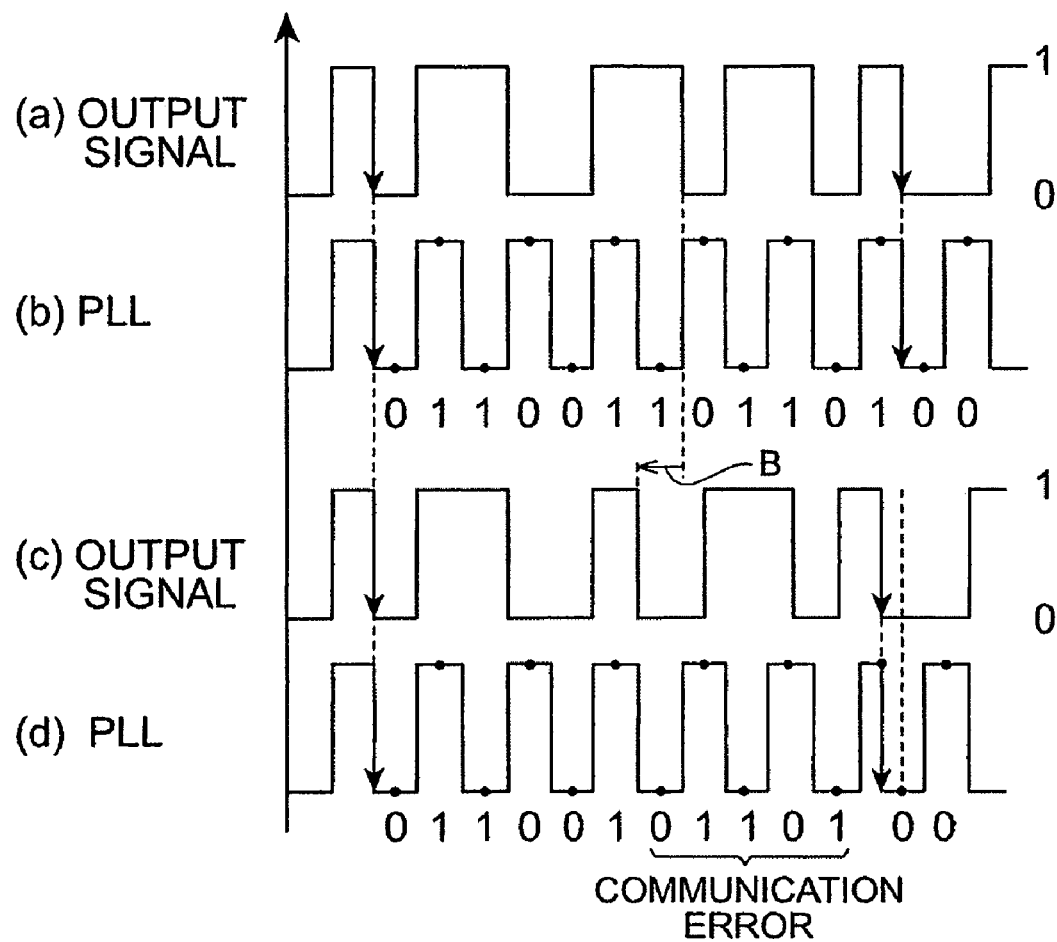
FIG. 5 is a timing chart showing an output signal and an internal signal of a PLL circuit.

FIG. 5 is a timing chart showing the output signal of the photodetector 10 and the internal signal of the PLL circuit.

The internal signal of the PLL circuit generates timing in synchronization with the output signal of the photodetector. The PLL circuit is operated so that the timing of an arrow of the internal signal (b) of the PLL circuit is coincident with the timing of an arrow in the output signal (a) of the photodetector 10. The value of an output signal when the gain switching is instantaneously carried out is shown at the lower stage of the internal signal (b).

When the gain adjustment is carried out in the photodetector 10, the phase of the output signal (c) is shifted as indicated by an arrow B. However, in this case, the internal signal (d) of the PLL circuit cannot follow the phase shift, and thus it indicates a communication error. Accordingly, if the gain switching operation is slowly carried out with such a sufficient time that the PLL circuit in the PHY chip 107 can sufficiently follow the phase shift concerned, the phase variation occurs slowly, and thus no communication error is induced.

The photodetector 10 is equipped with an optical power detector for detecting the power of the photodiode, and a gain adjusting amplifier for carrying out the above gain adjustment on the basis of the signal of the optical power detector. When the gain switching operation based on the gain adjustment amplifier is rapid, the above problem occurs. Therefore, in the photodetector 10, a low pass filter is provided between the optical detector and the gain adjusting amplifier.

Figure 6:
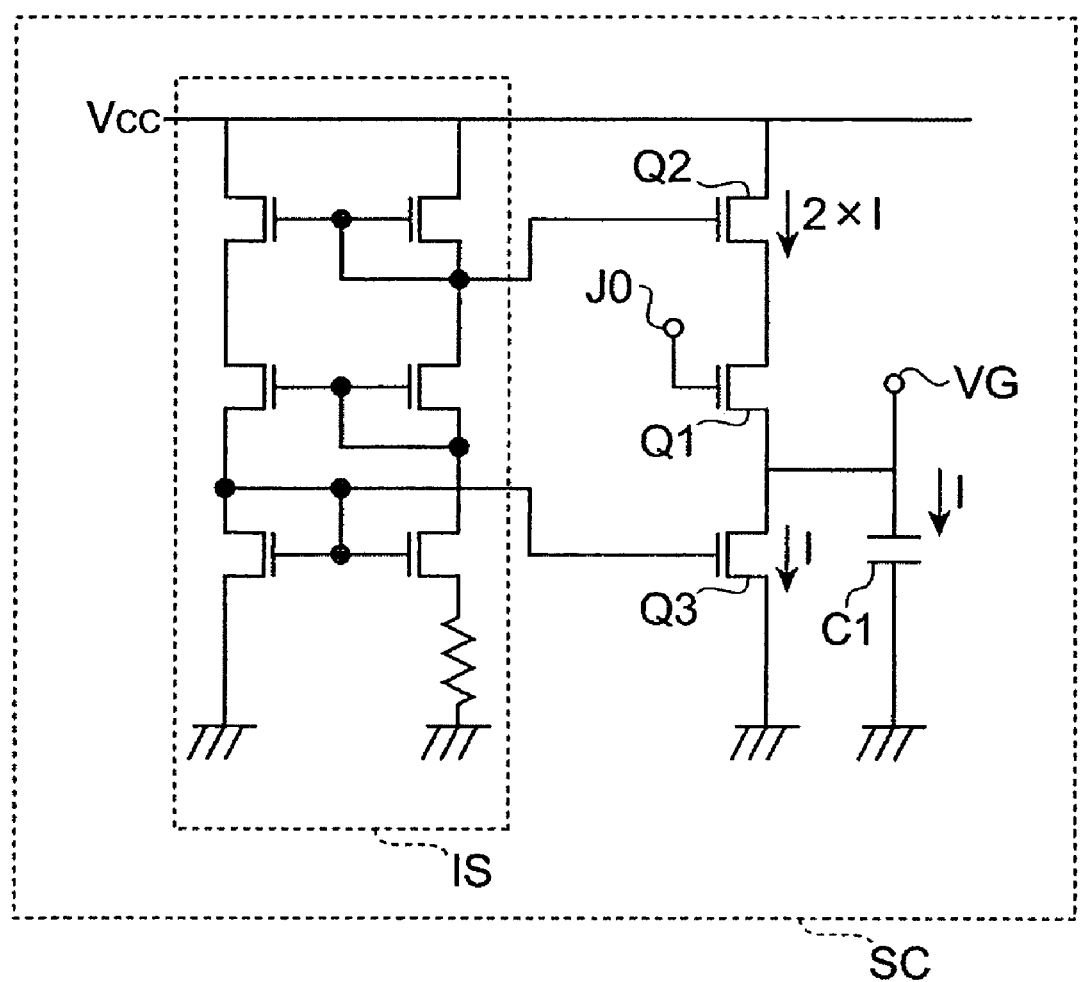
FIG. 6 is a circuit diagram showing a low pass filter.

FIG. 6 is a circuit diagram of a low pass filter SC having bias circuit.

The output of the optical power detector is input to the judgment output terminal JO. The judgment output terminal JO constitutes the control terminal of the transistor Q1. A transistor Q2, a transistor Q1 and a transistor Q3 are successively interposed in series between the power source potential Vcc and the ground potential, and the connection potential (terminal VG) between the transistor Q1 and the transistor Q3 is connected to the ground via a capacitor C1. The transistor Q3 and the capacitor C1 are connected to the connection potential in parallel.

When the transistor Q1 is turned on by inputting, for example, a high-level signal to the judgment output terminal JO, current of 2×I flows from the power source potential Vcc. This 2×I is branched so that current I is supplied to the transistor Q3 and current I is supplied to the capacitor C1. It can be considered that these currents are supplied from a current source composed of the transistors Q2 and Q3 which are connected to the current mirror circuit (bias current) IS and the current mirror circuit IS connected as shown in the figure.

Figure 7:
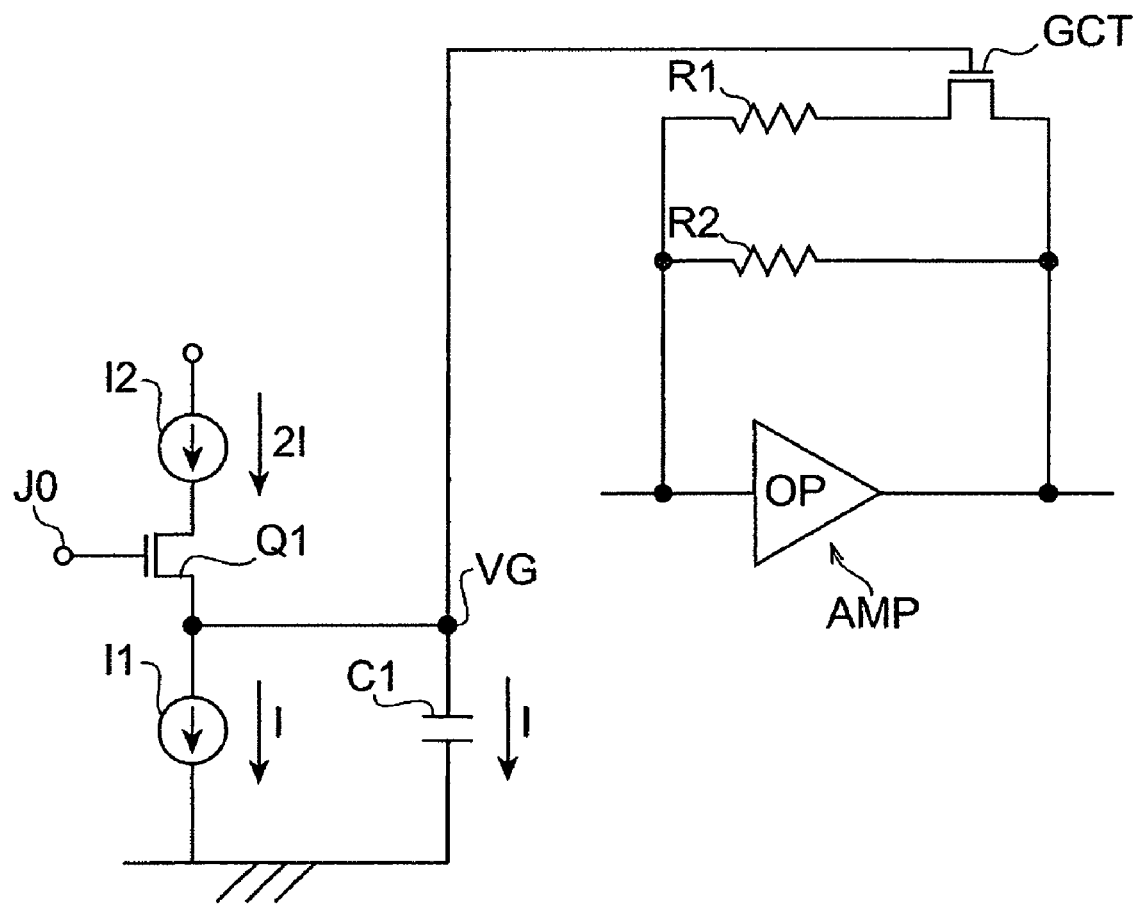
FIG. 7 is a circuit diagram showing the function of the low pass filter.

FIG. 7 is a circuit diagram showing the function of the low pass filter at the transistor ON time.

When the optical power is increased and thus, for example, a high-level signal is input to the judgment output terminal JO, the transistor Q1 is turned on, and in accordance with the current I supplied from the current source I2, the potential of the gain adjusting terminal VG is continued to increase gradually until the accumulation of charges in the capacitor C1 is finished. The current I also flows into the current source I1. In other words, many high harmonic components contained in a square wave input to the judgment output terminal JO are removed, and a voltage curved line which increases smoothly is achieved.

In this case, the gain may be controlled to be reduced in accordance with the increase in the optical power.

In order to increase the gain of the gain adjustment amplifier AMP, the resistance value of a feedback resistor of the operational amplifier OP may be increased. In order to reduce the gain, the resistance value of the feedback resistor of the operational amplifier OP may be reduced. The feedback resistor means a composite resistor of a plurality of resistors R1 and R2 interposed in parallel between the input and output terminals of the operational amplifier OP, and it is given by the resistance value of the composite resistor Rx=(R1×R2)/

(R1+R2). The resistors are represented by the same reference numerals as the resistance values.

The gain adjusting transistor GCT is connected to the resistor R1 in series. When the transistor GCT is turned on (conducted), the resistor R1 is installed in the composite resistor Rx, and when the transistor GCT is turned off (disconnected), the resistance value of the resistor R1 is equivalently infinite. The resistor R1 is set to 750Ω, the resistor R2 is set to 10 kΩ and the resistance value Rx of the composite resistor at the transistor ON time is equal to approximately 700Ω.

When the transistor GCT is turned on, the resistance value Rx of the composite resistor is reduced, and when it is turned off, the resistance value Rx is increased.

That is, when the optical power is increased, the gain should be reduced. In this case, the resistance value Rx of the composite resistor must be lowered, and thus the transistor GCT must be turned on. Furthermore, the potential of the control terminal VG is increased when the optical power is increased, and thus an N-type MOS transistor which is turned on in accordance with the increase in the control terminal voltage may be adopted as the transistor GCT. The transistor Q1 having, as the gate, the judgment output terminal JO turning on in accordance with the increase in the voltage level is constructed by an N-type MOS transistor.

As described above, the gain adjusting amplifier AMP is equipped with a plurality of resistors R1 and R2 interposed in parallel between the input and output terminals of the operational amplifier OP, and a transistor GCT connected to the resistor R1 in series, and the control terminal of the transistor GCT is set as a gain adjusting terminal VG. The resistance value of the resistor or the number of resistors connecting the input and output terminals of the operational amplifier OP is varied corresponding to the input to the gain control terminal, and thus the gain adjustment can be performed.

Figure 8:
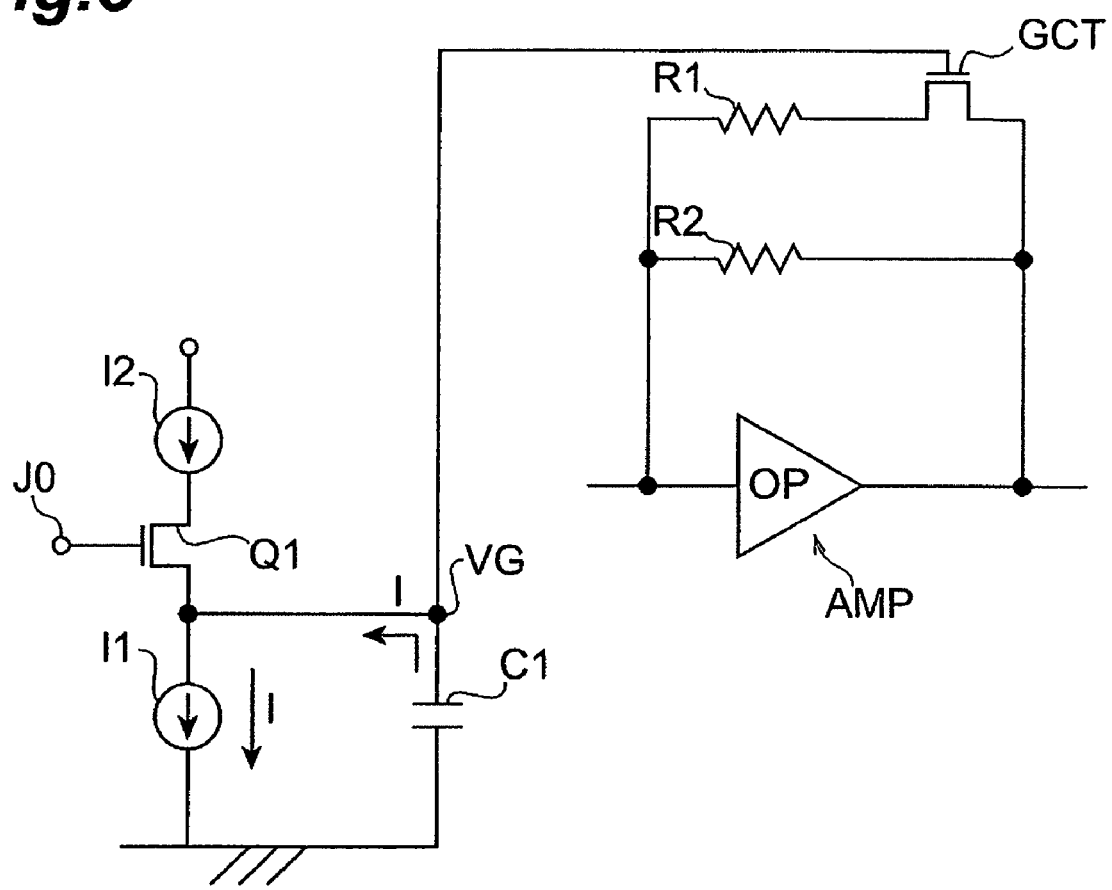
FIG. 8 is a circuit diagram showing the function of the low pass filter.

FIG. 8 is a circuit diagram showing the function of the low pass filter at the transistor OFF time.

When the optical power is reduced and, for example, a low-level signal is input to the judgment output terminal JO, the transistor Q1 is turned off, and the potential of the gain adjusting terminal VG is continued to decrease gradually while charges accumulated in the capacitor C1 continue to flow to the ground via the current source I1. In other words, many high harmonic components contained in a square wave input to the judgment output terminal JO are removed, and a smoothly-decreasing voltage curved line can be achieved.

In this case, the gain may be controlled to increase in accordance with the decrease in the optical power.

Since the potential of the gain adjusting terminal VG decreases gradually, the transistor GCT is turned off, the resistance value Rx of the composite resistor is increased, and the gain of the gain adjusting amplifier AMP is increased.

Figure 9:
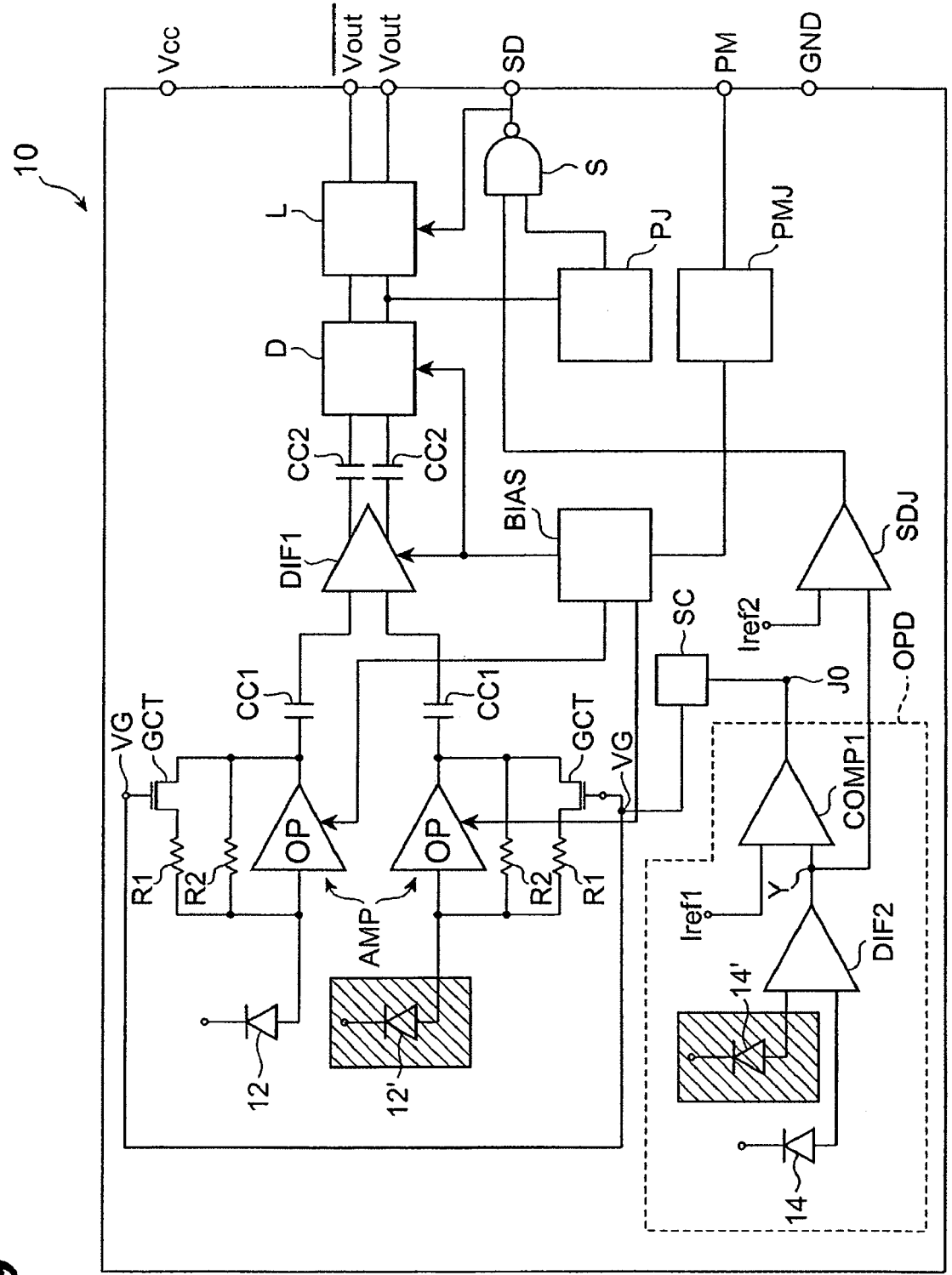
FIG. 9 is a circuit diagram showing a photodetector.

FIG. 9 is a circuit diagram showing the photodetector.

The photodetector 10 has the first photodiode 12 for photodetecting, the light-shielded second photodiode 12', and a first differential amplifier DIF1 to which the outputs of the first and second photodiodes 12, 12' are input. The outputs of the first and second photodiodes 12, 12' are input to the first differential amplifier, so that dark current commonly flowing into both the first and second photodiodes 12, 12' is removed and thus low noise can be achieved.

The photodetector 10 has gain adjusting amplifiers AMP which are respectively interposed between the first photodiode 12 and the first differential amplifier DIF1 and between the second photodiode 12' and the first differential amplifier DIF1. The gain adjusting amplifier AMP functions as described above. The gain adjusting amplifier AMP is a pre-amplifier. The gain adjusting amplifier AMP can adjust the gain corresponding to the input to the gain adjusting terminal VG (in this embodiment, the gate of the MOS transistor). Therefore, the saturation of the gain adjusting amplifier AMP can be suppressed and the dynamic range can be broadened by inputting the output of the optical power detector OPD to the gain adjusting terminal VG via the low pass filter SC. The optical power detector OPD detects the optical power on the basis of the output of the comparator (the output of COMP1). The optical power detector OPD can vary its output at high speed with respect to the optical power exceeding a specified level because it uses the output of the comparator.

However, in high-speed communications, particularly in a case where a PHY chip having a PLL circuit at the rear stage side is disposed, such a communication error as described above occurs when phase synchronization is carried out by the PLL circuit concerned. In the photodetector 10, the low pass filter SC is interposed between the output terminal JO of the optical power detector OPD and the gain adjusting terminal VG of the gain adjusting amplifier AMP.

Accordingly, the low pass filter SC cuts high frequency components (high harmonic components) from the stepwise-varying square wave and slowly varies the output of the comparator as the comparator COMP1. Accordingly, the variation rate of the input to the gain adjusting terminal VG can be restricted. In accordance with this restriction, the resistance value of the gain adjusting transistor for executing the ON/OFF switching operation finally varies smoothly, the composite resistance value Rx for determining the gain varies smoothly, a smooth gain variation can be implemented, and errors in rear-stage circuits can be suppressed. That is, high-speed communications can be performed.

The optical power detector OPD is equipped with the third photodiode 14 for photodetecting, the light-shielded fourth photodiode 14', the second differential amplifier DIF2 to which the outputs of the third and fourth photodiodes 14, 14' are input, and the comparator COMP1 to which the output of the second differential amplifier DIF2 is input.

In this case, the outputs of the third and fourth photodiodes 14, 14' are input to the second differential amplifier DIF2, so that the dark current commonly flowing into both the photodiodes is removed and an output of low noise can be achieved from the second differential amplifier DIF2. The output of the second differential amplifier DIF2 is input to the comparator COMP1. When photocurrent (the optical power to the photodiode) exceeding a reference level (reference current Iref1) is input to the comparator, the output thereof is switched. In this embodiment, it is assumed that when the optical power is high, a high-level signal is output.

The outputs of the first differential amplifier DIF1 (complementary signals: output signal and inverted output signal) are input to the differential amplifying circuit D, and the complementary signals of the output thereof are input to the LVDS level adjusting circuit L to be adjusted in level, and then output.

When the output of the second differential amplifier DIF2 is input to the signal detection judging circuit SDJ and photocurrent (the optical power of the photodiode) exceeding a reference level (reference current Iref2) is input, the output thereof is switched, and a high level is output. A part of the output of the differential amplifying circuit D is input to the peak detector PJ, and it is input to a NAND circuit S together with the output of a signal detection judging circuit SDJ. The NAND circuit S judges the presence or absence of the input of an optical signal having a specified value or more to the photodiodes 12, 14, and outputs a judgment result to the signal detection terminal SD. In addition, the LVDS level adjusting circuit L carries out level adjustment on the LVDS signal corresponding to the judgment result.

The input from a power management terminal PM is input to a power management judging circuit PMJ, and when no high-level voltage is applied to the power management judging circuit PMJ, the bias circuit BIAS is interrupted, and the overall circuit is shut down. The bias circuit BIAS supplies the overall circuit containing the differential amplifying circuit D, the first differential amplifier DIF1, the gain adjusting amplifier AMP, etc., with a power source voltage or adjusted voltage supplied from the power source terminal Vcc.

The photodiodes 12, 14 for photodetecting are disposed in proximity to each other, and the light-shielded dummy photodiodes 12' and 14' are also disposed in proximity to each other. More specifically, the photodiode 14 for detecting leak light is located around the photodiode 12 for photodetecting, and the dummy photodiode 14' is located around the dummy photodiode 12' for photodetecting. The light amount of the leak light is smaller than the light amount of light made incident to the photodiode 12 for photodetecting.

Capacitors CC1 are interposed between the gain adjusting amplifier AMP and the first differential amplifier DIF1. These capacitors are capacitance-coupled to each other, and low frequency components of a signal passing via these capacitors are removed (low band cut-off filter). Accordingly, the DC components of an input voltage to the first differential amplifier DIF1 are cut, and thus the operational restriction of the first differential amplifier DIF1 by the output voltage of the gain adjusting amplifier AMP can be released. That is, the dynamic range of the gain adjusting amplifier AMP can be broadened. For example, when the capacitance of the capacitor CC1 is set to 8.2 pF and resistors of 65Ω (not shown) are connected to each other in parallel, the cut-off frequency is equal to 300 kHz.

Furthermore, capacitors CC2 are also interposed between the first differential amplifier DIF1 and the differential amplifying circuit D. These capacitors can cut the DC components of complementary signals output from the first differential amplifier DIF1 and thus enhance the minimum receiving level. The other condition on the capacitors CC2 is the same as the capacitors CC1.

Figure 10:
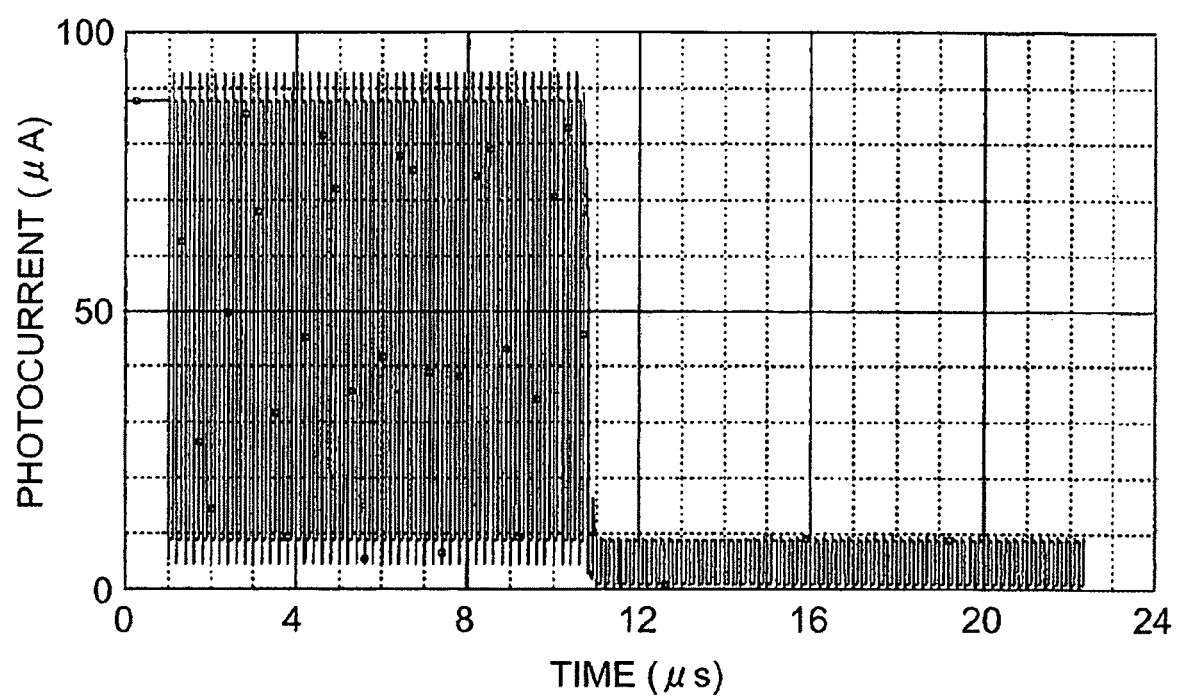
FIG. 10 is a graph showing the time-dependence of photocurrent.

FIG. 10 is a graph showing the time-dependence of photocurrent.

The photocurrent is equal to 90 µA from 0 to 11 µs, however, the photocurrent rapidly decreases after 11 µs.

Figure 11:
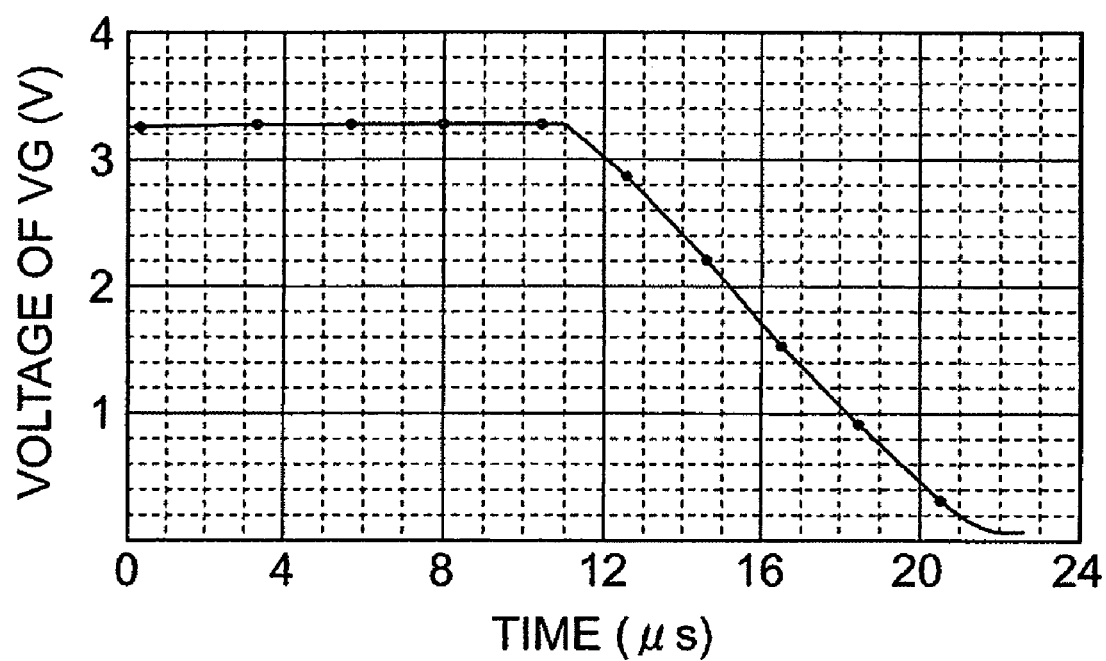
FIG. 11 is a graph showing the time-dependence of the voltage of the gain adjusting terminal.

FIG. 11 is a graph showing the time-dependence of the voltage of the gain adjusting terminal VG.

The photocurrent output of the photodiode for detecting the optical power is lowered after 11 µs. Therefore, the voltage of the gain adjusting terminal VG is gradually lowered, the current amount flowing between the source and drain of the gain-adjusting N-type MOS transistor GCT to which the voltage is applied is gradually lowered, the current amount flowing in the resistor R1 decreases, and the resistance value Rx of the composite resistor increases, so that the gain of the gain adjusting amplifier AMP gradually increases to the specified gain after 11 µs (see FIG. 8).

Figure 12:
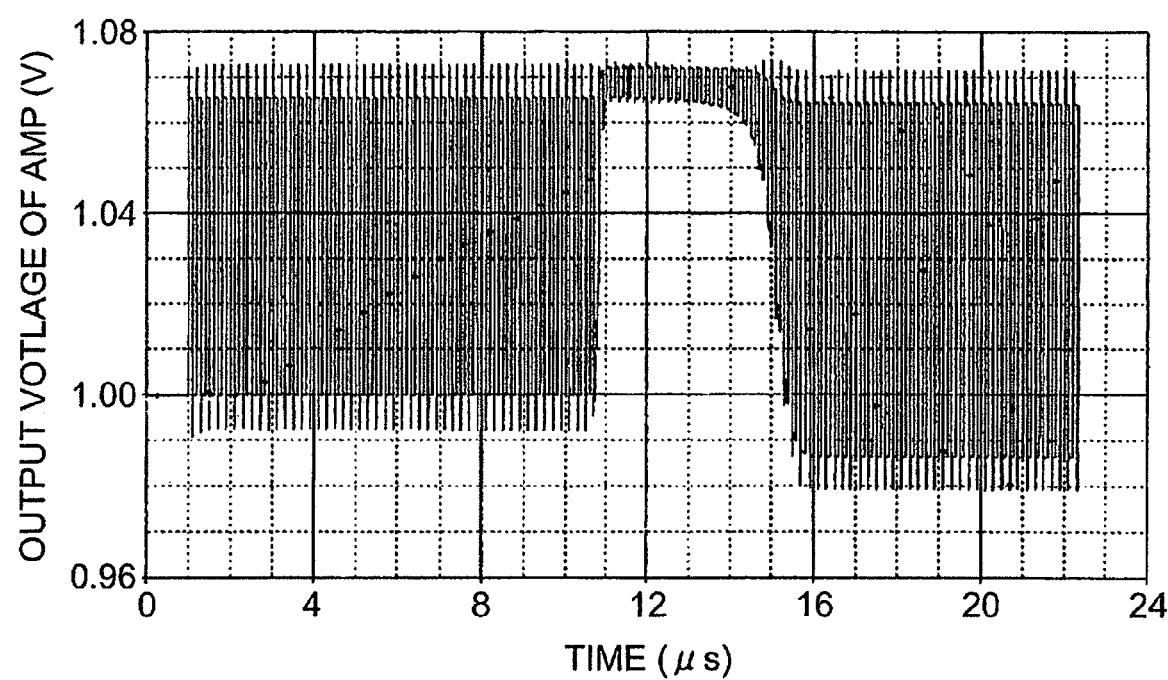
FIG. 12 is a graph showing the time-dependence of an output voltage of a gain adjusting amplifier.

FIG. 12 is a graph showing the time-dependence of the output voltage of the gain adjusting amplifier AMP.

The output voltage of the gain adjusting amplifier AMP gradually increases from 13 µs after 11 µs, and reaches the specified voltage until the time reaches 16 µs. In this case, the time period from the increase in the output voltage until the saturation of the output voltage is within 3 µs. As described above, by varying the gain of the output voltage slowly, the adverse effect on the PHY chip connected at the rear stage can be suppressed. The delay time after the switching of the output of the comparator until the output voltage of the gain adjusting amplifier AMP is saturated can be adjusted by the values of the current source I1 and the capacitor C1 in FIG. 8. The low pass filter also functions as a delay circuit.

Figure 13:
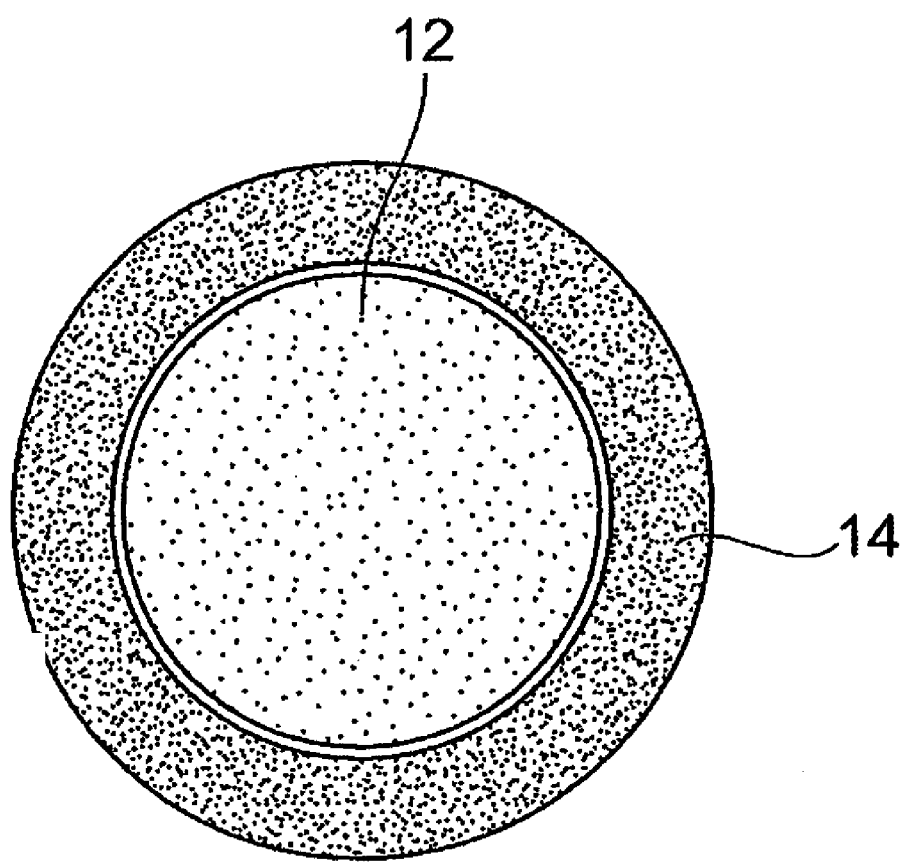
FIG. 13 is a plan view showing a photodiode.

FIG. 13 is a plan view of the photodiode.

The photodiode 14 surrounds the photodiode 12. The photodiode 12 is designed to have a circular shape, the photodiode 14 is designed to have an annular shape, and these photodiodes are arranged, concentrically. Any one or both of the outer edges of the photodiodes 12 and 14 may be designed in a polygonal shape such as a square shape, a hexagonal shape or the like.

Figure 14:
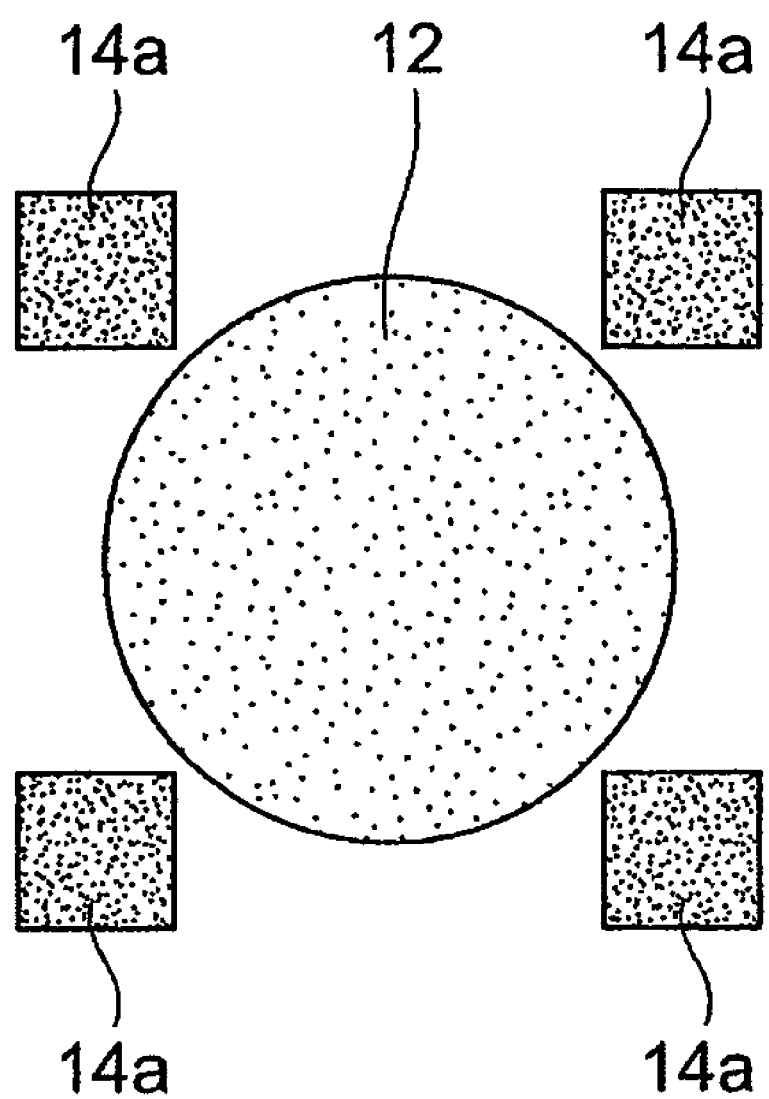
FIG. 14 is a plan view showing a photodiode.

FIG. 14 is a plan view showing the photodiode.

The photodiode 14 may compose a plurality of (for example, four) separated detectors 14a which are arranged along the edge portion of the photosensitive area of the photodiode 12. In this case, it is preferable that the plurality of photodetectors 14a are arranged at an equal interval along the edge portion of the photosensitive area of the photodiode 12, and the plurality of photodetectors 14a are arranged at an equal distance from the center of the photosensitive area of the photodiode 12.

The shapes of the photodiodes 12' and 14' are the same as the photodiodes 12 and 14.

Figure 15:
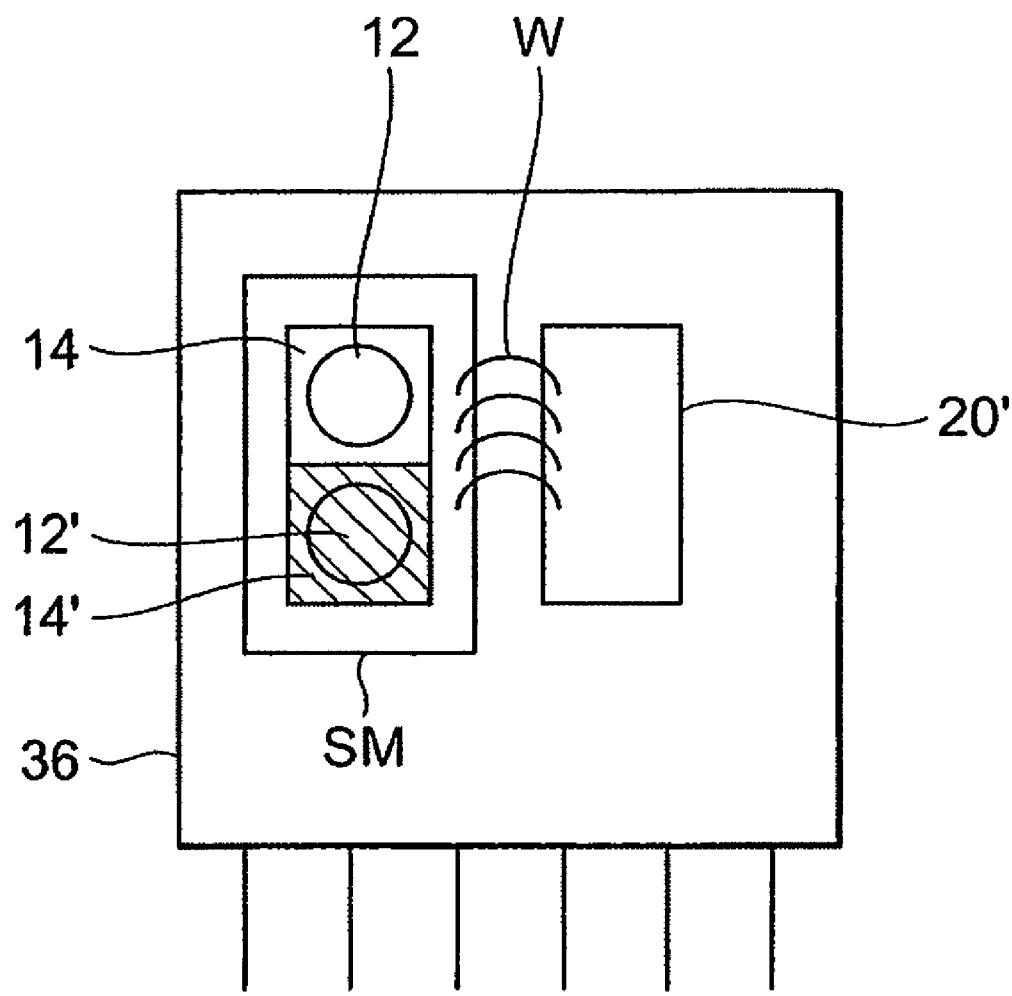
FIG. 15 is a diagram showing an arrangement example of the internal circuit of the photodetector.

FIG. 15 is a diagram showing an arrangement example of the internal circuit of the photodetector.

In the above-described example, the photodiodes 12, 14, the photodiodes 12', 14' and the internal circuit of the photodetector 10 are formed in the same semiconductor substrate 20. However, in this embodiment, the photodiodes 12, 14 and the photodiodes 12' and 14' are formed in the same semiconductor substrate SM, a separately-provided integrated circuit chip 20' is provided to the semiconductor substrate SM via a wire W, and these elements are embedded in a resin mold portion 36.

That is, the internal circuit of the photodetector 10 is monolithically formed in the integrated circuit chip 20'. The internal circuit of the PHY chip may be formed in the integrated circuit chip 20', or the photodiode may be formed in the same semiconductor substrate.

Figure 16:
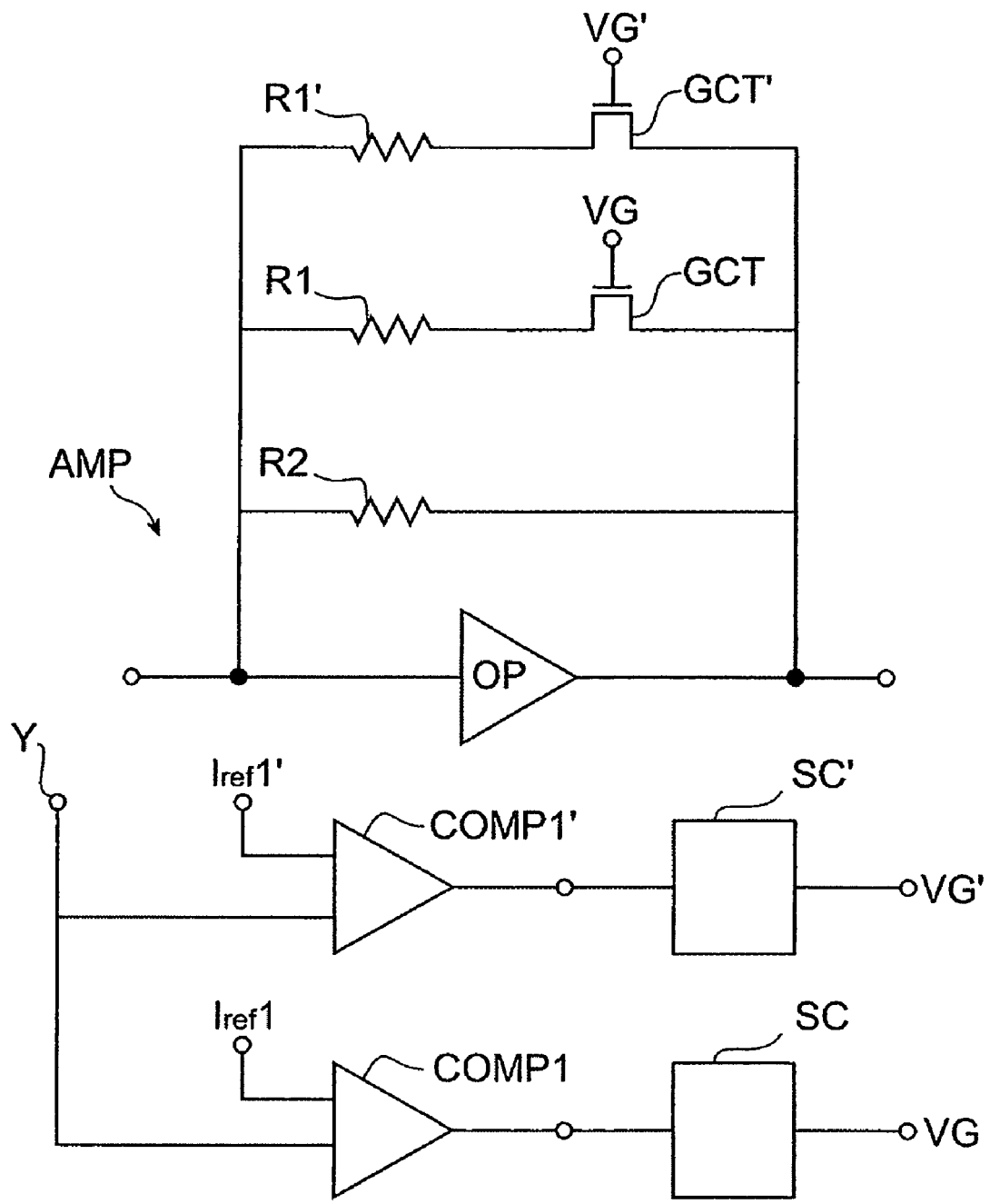
FIG. 16 is a circuit diagram showing a gain adjusting amplifier AMP and a circuit for a comparator output.

FIG. 16 is a circuit diagram showing the gain adjusting amplifier AMP and the circuit for the output of the comparator.

In the above example, the output of the comparator varies in one stage, however, it can be set to vary in two stages. In this example, there are provided a comparator COMP1' which is further connected to the output terminal Y of the second differential amplifier DIF2 of FIG. 9, and a low pass filter SC', and also a resistor R1' and a transistor GCT' which are connected to the resistor R1 in parallel are provided at the gain adjusting amplifier AMP side. The functions of the comparator COMP1', the low pass filter SC', the gain adjusting terminal VG', the resistor R1' and the transistor GCT' are the same as the comparator COMP1, the low pass filter SC, the gain adjusting terminal VG, the resistor R1 and the transistor GCT, respectively, however, the current value of the reference current Iref1' and the resistance value of the resistor R1' are different.

In the above example, the resistance values of the resistors R2 and R1 are set so as to satisfy R2>R1. In this example, R2>R1>R1' are set. These resistance values may be equal to one another, however, the reference current Iref1' is set to be larger than Iref1. The output of the comparator may be varied in three or more stages, and a voltage input construction may be adopted as the input to the comparator.

Figure 17:
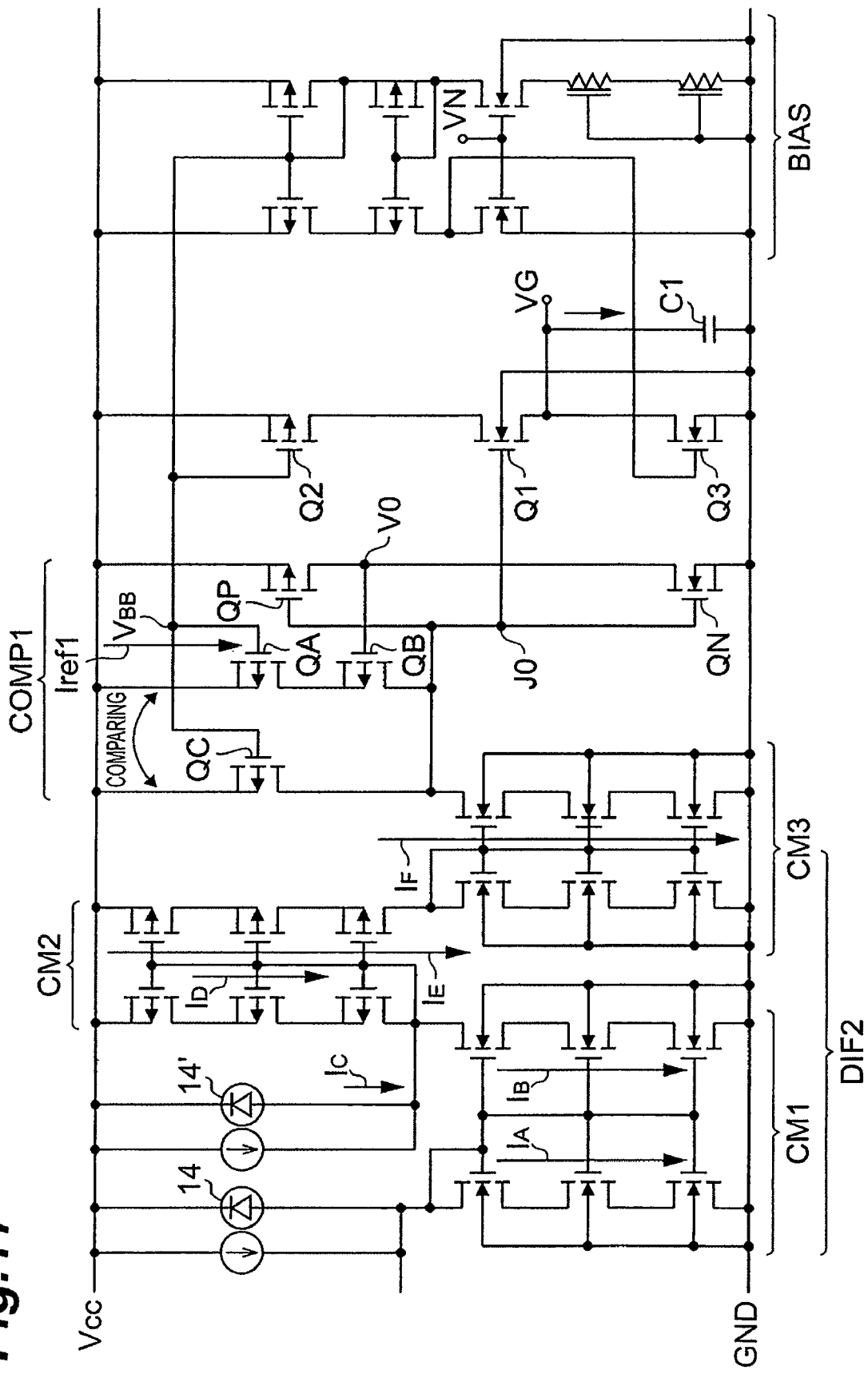
FIG. 17 is a circuit diagram showing an actual optical power detecting circuit.

FIG. 17 is a circuit diagram showing the actual optical power detecting circuit.

The photodiode 14 for detecting optical power and the light-shielded photodiode 14' are connected to each other in parallel between the specified potential and the ground potential, and a plurality of N-type MOS transistors constituting an input side line are connected to the photodiode 14 in series, a plurality of N-type MOS transistors constituting an output side line are connected to the photodiode 14' in series, and the transistors of the input side line and the output side line constitute a current mirror circuit CM1. The current $I_A$ flowing via the input side line of the current mirror circuit CM1 and the current $I_B$ flowing via the output side line are equal to each other, and the shapes of the photodiodes 14, 14' are identical to each other.

Dark current $I_C$ flows via the light-shielded photodiode 14', and thus the current $I_D$ achieved by subtracting the dark current $I_C$ from the current $I_A$ for detecting the optical power flows via P-type MOS transistors which are connected to the power supply side of the output side line of the current mirror circuit CM1 in series. These P-type MOS transistors constitute the input side line of the current mirror circuit CM2, and the current $I_B$ is amplified by P-type MOS transistors connected to the output side line thereof in series, so that current $I_E$ flows via the current mirror circuit CM2. Furthermore, current $I_F$ flows via the output side line of the current mirror circuit CM3 by a current mirror circuit CM3 in which the output side line of the current mirror circuit CM2 are set as the input side line constituting the plurality of N-type MOS transistors.

The plurality of N-type MOS transistors are connected to the output side line of the current mirror circuit CM3 in series. The above current mirror circuits CM1 to CM3 constitute the second differential amplifier DIF2. That is, the current $I_F$ is optical power detecting current from which the dark current is subtracted and which is amplified.

A P-type MOS transistor QC is interposed at the power source side of the output side line of the current mirror circuit CM3, and a predetermined potential $V_{BB}$ is applied to the gate from the bias circuit BIAS. A plurality of P-type MOS transistors QA, QB through which the reference current Iref1 flows are connected to each other in series between the drain of the P-type MOS transistor QC and the power source potential, the potential $V_{BB}$ from the bias circuit BIAS is applied to the gate of the P-type MOS transistor QA at the upstream side, and the CMOS connection type output potential VO is applied to the gate of the P-type MOS transistor QB at the downstream side.

The output potential VO of the CMOS connection type is the potential of the connection point between the P-type MOS transistor QP and the N-type MOS transistor QN which are connected to each other in series between the power source potential and the ground potential. The gates of these transistors QP and QN are connected to the drain of the transistor QB, and this connection point becomes the judgment output terminal JO described above.

The judgment output terminal JO is input to the gate of the N-type MOS transistor Q1, and when the potential of the judgment output terminal JO is in high level, the current is supplied from the P-type MOS transistor Q2 at the power source potential side of the N-type MOS transistor Q1 to the N-type MOS transistor Q1. The potential of the judgment output terminal JO is set to high level when the optical power detecting current $I_F$ exceeds the reference current Iref1, and thus the transistors QA, QB, QC, QP, and QN constitute the comparator COMP1. When the potential of the judgment output terminal JO is set to high level, charges are supplied from the P-type MOS transistor Q2 to the capacitor C1, and the potential of the gain adjusting terminal VG increases gradually.

Furthermore, when the potential of the judgment output terminal JO is set to low level, charges which are accumulated in the capacitor C1 via the N-type MOS transistor Q3 flow to the ground potential. The gate potential of the N-type MOS transistor Q3 is the potential VN in the bias circuit BIAS.

Figure 18:
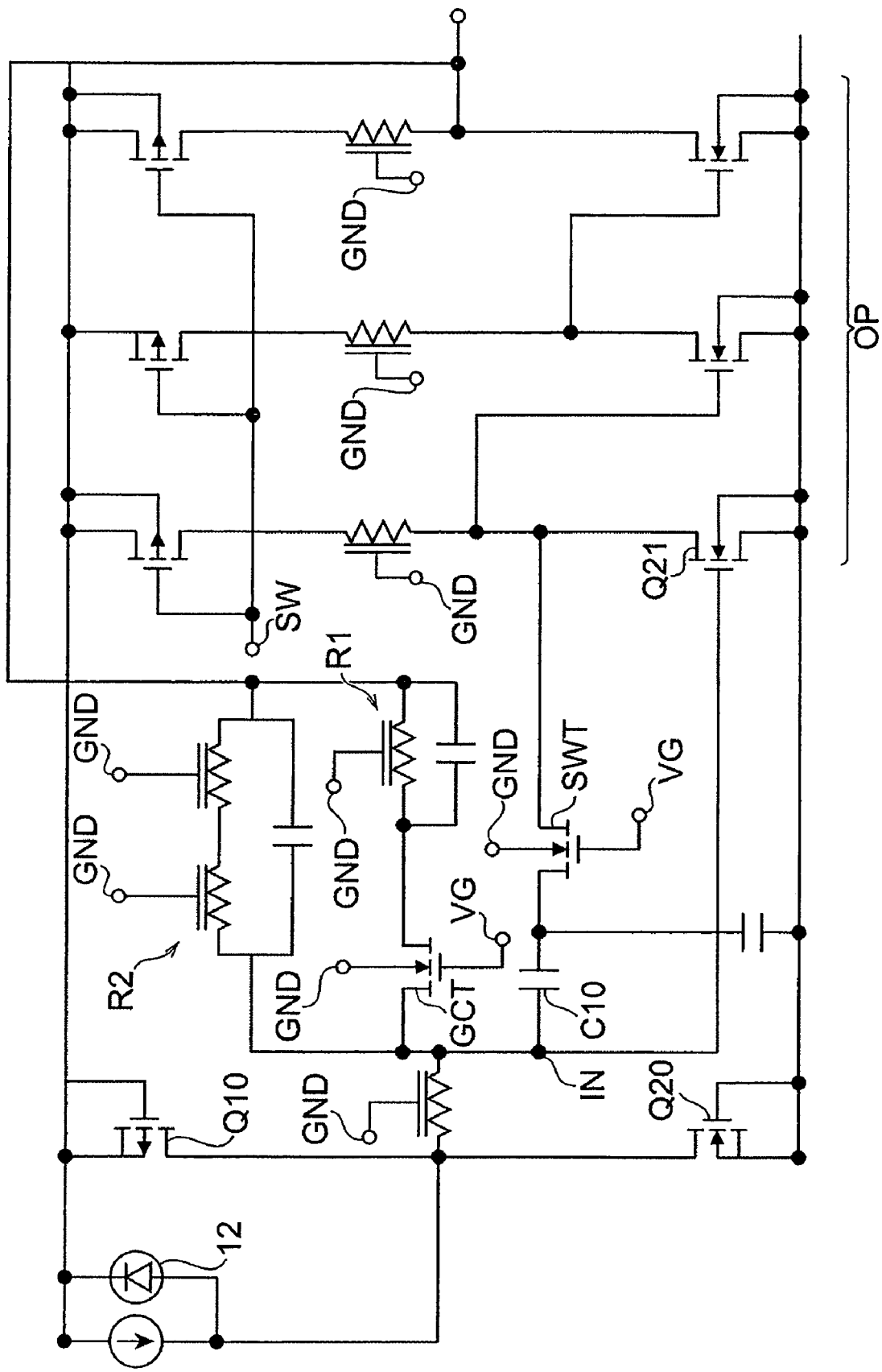
FIG. 18 is a circuit diagram showing an actual gain adjusting amplifier.

FIG. 18 is a circuit diagram of the actual gain adjusting amplifier.

In this circuit diagram, the dummy photodiode 12' is omitted. A reverse bias voltage is applied to the photodiode 12 for receiving an optical signal, and the anode side potential is the node point between the P-type MOS transistor Q10 and the N-type MOS transistor Q20. This potential is applied to the input terminal IN of the operational amplifier OP constituting the P-type MOS transistor and the N-type MOS transistor, and it is amplified in proportion to the composite resistor of the resistors R1 and R2. When the voltage of the gain adjusting terminal VG as the gate of the N-type MOS transistor GCT for adjusting the gain is lowered, the resistance value Rx of the composite resistor increases, and thus the gain increases.

A capacitor C10 and an N-type MOS transistor SWT are connected between the input terminal IN and the drain of the NMOS transistor Q21 at the initial stage, and the potential of the gain adjusting terminal VG is also applied to the gate of the N-type MOS transistor SWT. When the optical power is large and the gain of the amplifier is small, that is, when the level of the gain adjusting terminal VG is high, N-type MOS transistor SWT is connected and the high frequency components are applied to the drain of the N-type MOS transistor Q21. Furthermore, a specified potential SW is applied to the terminal connected to the gate of the P-type MOS transistor of the operational amplifier OP.

An MOS type field effect transistor is used as the above-described transistor, however, it may be a bipolar transistor.

INDUSTRIAL APPLICABILITY

The present invention is usable for a photodetector applicable to communications requiring a high speed and broad dynamic range.

The invention claimed is:
1. A photodetector comprising:
a first photodiode for light receiving;
a light-shielded second photodiode;
a first differential amplifier to which the outputs of the first and second photodiodes are input;
gain adjusting amplifiers that are interposed between the first photodiode and the first differential amplifier and the second photodiode and the first differential amplifier respectively;

an optical power detector for detecting optical power on the basis of an output of a comparator; and a low pass filter interposed between an output terminal of the optical power detector and a gain adjusting terminal of the gain adjusting amplifier.

2. The photodetector according to claim 1, wherein the optical power detector comprises:

a third photodiode for light receiving;

a light-shielded fourth photodiode;

a second differential amplifier to which the outputs of the third and fourth photodiodes are input; and the comparator to which the output of the second differential amplifier is input.

3. The photodetector according to claim 1, wherein the gain adjusting amplifier comprises:

a plurality of resistors interposed between the input and output terminals of an operational amplifier in parallel; and a transistor connected to the resistor in series, wherein the control terminal of the transistor is set as the gain adjusting terminal.

4. The photodetector according to claim 2, wherein the gain adjusting amplifier comprises:

a plurality of resistors interposed between the input and output terminals of an operational amplifier in parallel; and a transistor connected to the resistor in series, wherein the control terminal of the transistor is set as the gain adjusting terminal.

* * * * *